US011869617B2

(12) United States Patent
Liu et al.

(10) Patent No.: US 11,869,617 B2
(45) Date of Patent: Jan. 9, 2024

(54) SELF-REPAIR FOR SEQUENTIAL SRAM

(71) Applicant: Meta Platforms Technologies, LLC, Menlo Park, CA (US)

(72) Inventors: Huichu Liu, Santa Clara, CA (US); Edith Dallard, San Mateo, CA (US); Daniel Henry Morris, Mountain View, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/658,740

(22) Filed: Apr. 11, 2022

(65) Prior Publication Data

US 2023/0065591 A1 Mar. 2, 2023

Related U.S. Application Data

(60) Provisional application No. 63/239,687, filed on Sep. 1, 2021.

(51) Int. Cl.
*G11C 29/18* (2006.01)
*G11C 29/44* (2006.01)
(Continued)

(52) U.S. Cl.
CPC .... *G11C 29/4401* (2013.01); *G11C 29/12015* (2013.01); *G11C 29/18* (2013.01);
(Continued)

(58) Field of Classification Search
CPC .......... G11C 29/4401; G11C 29/12015; G11C 29/18; G11C 29/789; G11C 2029/1202;
(Continued)

(56) References Cited

U.S. PATENT DOCUMENTS

| 2003/0179635 A1* | 9/2003 | Terzioglu ............... G11C 29/50 365/201 |
| 2020/0020388 A1 | 1/2020 | Arsovski et al. |
| 2020/0243130 A1 | 7/2020 | Arsovski et al. |

FOREIGN PATENT DOCUMENTS

EP 3843099 A1 6/2021

OTHER PUBLICATIONS

Augustine C., et al., "2X-Bandwidth Burst 6T-SRAM for Memory Bandwidth Limited Workloads," IEEE Symposium on VLSI Circuits, Jun. 16, 2020, 2 pages.

(Continued)

*Primary Examiner* — Mohammed A Bashar
(74) *Attorney, Agent, or Firm* — Weaver Austin Villeneuve & Sampson LLP

(57) ABSTRACT

In some embodiments, a system comprises a static random access memory (SRAM) device and a controller. The SRAM device comprises a bit cell array comprising a plurality of bit cells arranged in a plurality of rows and a plurality of columns, each column operatively coupled to a pair of bit lines, wherein the plurality of columns is arranged as a plurality of column groups each comprising a plurality of local columns. The SRAM device further comprises a plurality of column decoders, each associated with a column group of the plurality of column groups. In some embodiments, the controller may be configured to read the local columns included in the column group by, for a given local column, sensing a voltage difference on a corresponding pair of bit lines, in a rearranged sequential order that is different from a physical sequential order of the plurality of local columns.

29 Claims, 12 Drawing Sheets

(51) Int. Cl.
  *G11C 29/12* (2006.01)
  *G11C 29/00* (2006.01)
  *H03K 19/21* (2006.01)
  *H03K 19/173* (2006.01)

(52) U.S. Cl.
  CPC ....... *G11C 29/789* (2013.01); *H03K 19/1737* (2013.01); *H03K 19/21* (2013.01); *G11C 2029/1202* (2013.01); *G11C 2029/1204* (2013.01); *G11C 2029/1802* (2013.01)

(58) Field of Classification Search
  CPC .... G11C 2029/1204; G11C 2029/1802; H03K 19/1737; H03K 19/21
  See application file for complete search history.

(56) References Cited

OTHER PUBLICATIONS

International Search Report and Written Opinion for International Application No. PCT/US2022/042138, dated Jan. 23, 2023 20 pages.
Invitation to Pay Additional Fees for International Application No. PCT/US2022/042138, dated Dec. 1, 2022, 16 pages.

* cited by examiner

SELF-REPAIR FOR SEQUENTIAL SRAM

CROSS-REFERENCE TO RELATED APPLICATIONS

This application claims priority under 35 U.S.C. § 119 to U.S. Provisional Application No. 63/239,687, filed on Sep. 1, 2021, the contents of which are hereby incorporated by reference in their entirety for all purposes.

BACKGROUND

Systems on a Chip (SOCs) for virtual reality and augmented reality generally require low-power and high-performance static random-access memory (SRAM). Performing memory access operations on an SRAM device is a delicate process, which may cause functional failures, where one or more bit cells of a bit cell array fail, or parametric failures, where one or more bit cells of the bit cell array are slow or weak, thereby slowing down memory access. However, many conventional repair techniques cause additional device overhead and/or power consumption, which is problematic for many use-cases.

SUMMARY

This disclosure generally relates to self-repair for sequential SRAM. According to certain embodiments, a system may comprise and SRAM device and a controller. The SRAM device may comprise: a bit cell array comprising a plurality of bit cells, the plurality of bit cells arranged in a plurality of rows and a plurality of columns, each column of the plurality of columns operatively coupled to a pair of bit lines, wherein the plurality of columns is arranged as a plurality of column groups each comprising a plurality of local columns; a row decoder that is configured to operatively couple a word line to a row of the plurality of rows of bit cells based at least in part on a row address provided to the row decoder; and a plurality of column decoders, each associated with a column group of the plurality of column groups, wherein each column decoder is configured to operatively couple a data line to a local column of the plurality of local columns corresponding to a column group of the plurality of column groups associated with said column decoder. The controller may be configured to, for a column group of the plurality of column groups, read the local columns of the plurality of local columns included in the column group by, for a given local column, sensing a voltage difference on a corresponding pair of bit lines, in a rearranged sequential order that is different from a physical sequential order of the plurality of local columns in the column group.

In some examples, the rearranged sequential order is determined based at least in part on a reorder signal obtained by the controller. In some examples, the reorder signal is a binary signal. In some examples, the sequential order is a reverse of the physical sequential order. In some examples, the sequential order is determined based on an exclusive OR (XOR) operation of the reorder signal with bits of the column addresses associated with the local columns.

In some examples, sensing the voltage difference on the corresponding pair of bit lines in the sequential order that is different from the physical sequential order of the plurality of local columns comprises sensing the voltage difference of a pair of bit lines associated with a local column having a first access time prior to sensing the voltage difference of a pair of bit lines associated with a local column having a second access time, the second access time being longer than the first access time.

In some examples, the controller is further configured to provide a row address to the row decoder that causes the word line corresponding to the row of the plurality of rows associated with the row address to be asserted prior to reading the local columns of the plurality of local columns. In some examples, the controller is further configured to de-assert the word line after the local columns have been read in the rearranged sequential order.

In some examples, a signal representative of the rearranged sequential order is utilized by a column multiplexer to select local columns of the plurality of local columns in the rearranged sequential order.

According to certain embodiments, a system comprises an SRAM device and a controller. The SRAM device may comprise: a bit cell array comprising a plurality of bit cells, the plurality of bit cells arranged in a plurality of rows and a plurality of columns, each column of the plurality of columns operatively coupled to a pair of bit lines, wherein the plurality of columns is arranged as a plurality of column groups each comprising a plurality of local columns, and wherein the plurality of columns includes one or more redundant columns; a row decoder that is configured to operatively couple a word line to a row of the plurality of rows of bit cells based at least in part on a row address provided to the row decoder; and a plurality of column decoders, each associated with a column group of the plurality of column groups, wherein each column decoder is configured to operatively couple a data line to a local column of the plurality of local columns corresponding to a column group of the plurality of column groups associated with said column decoder. The controller may be configured to: obtain an address of a bit cell in the bit cell array for which a sequential memory access operation is to be performed, wherein the address comprises a row address, a column group identifier, and a local column address; map the row address, the column group identifier, and the local column address to a repaired address corresponding to a repaired bit cell, wherein the repaired address corresponds to a redundant column of the one or more redundant columns; provide the row address to the row decoder that causes the word line corresponding to a row of the plurality of rows associated with the row address to be asserted; and perform the sequential memory access operation at the repaired address by selecting the redundant column corresponding to the repaired address.

In some examples, a first bit cell of the redundant column corresponds to a faulty bit cell of a first local column and a second bit cell of the redundant column corresponds to a faulty bit cell of a second local column that is different than the first local column. In some examples, a row of the first bit cell of the redundant column is the same as a row of the faulty bit cell of the first local column.

In some examples, mapping the row address, the column group identifier, and the local column address to the repaired address comprises obtaining the repaired address from a look up table by providing the row address, the column group identifier, and the local column address to the look up table. In some examples, the look up table is pre-configured based on testing of the SRAM device. In some examples, the look up table is operatively coupled to a multiplexer configured to select the redundant column corresponding to the repaired address.

In some examples, the one or more redundant columns comprise at least two redundant columns, and wherein the at least two redundant columns are associated with different column groups of the plurality of column groups.

In some examples, the controller is further configured to pre-charge a set of bit lines corresponding to a plurality of local columns included in a column group corresponding to the column group identifier, and wherein mapping the row address, the column group identifier, and the local column address to the repaired address occurs concurrently with the pre-charging the set of bit lines.

In some examples, mapping the row address, the column group identifier, and the local column address to the repaired address occurs concurrently with the word line being asserted.

In some examples, at least one local column of the column group associated with the column group identifier does not have a corresponding redundant column included in the one or more redundant columns.

According to certain embodiments, a system comprises an SRAM device and a controller. The SRAM device may comprise: a bit cell array comprising a plurality of bit cells, the plurality of bit cells arranged in a plurality of rows and a plurality of columns, each column of the plurality of columns operatively coupled to a pair of bit lines, wherein the plurality of columns is arranged as a plurality of column groups each comprising a plurality of local columns; a row decoder that is configured to operatively couple a word line to a row of the plurality of rows of bit cells based at least in part on a row address provided to the row decoder; and a plurality of column decoders, each associated with a column group of the plurality of column groups, wherein each column decoder is configured to operatively couple a data line to a local column of the plurality of local columns corresponding to a column group of the plurality of column groups associated with said column decoder. The controller may be configured to, for a column group of the plurality of column groups: provide a row address to the row decoder that causes the word line corresponding to a row of the plurality of rows associated with the row address to be asserted; responsive to determining that a sequential memory access operation of a series of memory access operations is to be performed on a slow bit line of the one or more bit lines having an access time that is longer than the access times associated with at least one other bit line of the one or more bit lines, causing a delay of at least a subset of memory access operations of the series of memory access operations; and perform the at least the subset of memory access operations after a time period associated with the delay has elapsed.

In some examples, causing the delay of at least the subset of memory access operations is responsive to enabling of a stall signal, and wherein performing the at least the subset of the memory access operations after the time period associated with the delay has elapsed is responsive to disabling the stall signals. In some examples, enabling the stall signal and disabling the stall signal is performed using a handshaking protocol associated with performing the series of memory access operations. In some examples, the handshaking protocol is associated with a row stride and/or a column stride for performing the series of memory access operations.

In some examples, the series of memory access operations comprise a series of read operations. In some examples, pre-charging of the one or more bit lines is extended during the time period. In some examples, the at least the subset of memory access operations comprises all of the memory access operations in the series of memory access operations.

In some examples, the series of memory access operations comprise a series of write operations. In some examples, the slow bit line is driven during the time period. In some examples, the at least the subset of memory access operations comprises memory access operations subsequent to access of the local column associated with the slow bit line.

In some examples, the time period corresponds to a clock cycle.

BRIEF DESCRIPTION OF THE DRAWINGS

Illustrative embodiments are described in detail below with reference to the following figures.

Figure 1A:
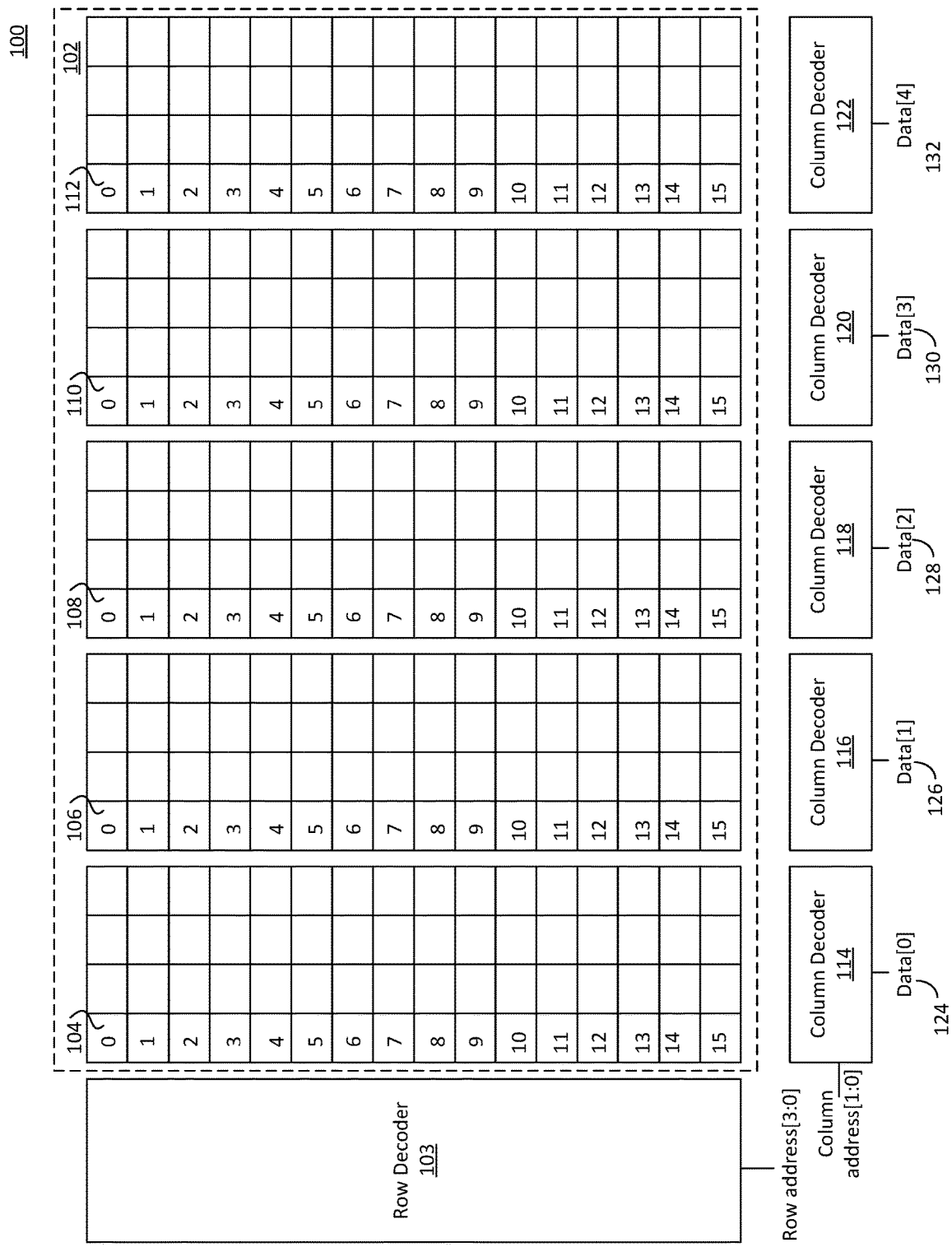
FIG. 1A is an schematic diagram that shows an example implementation of a static random access memory (SRAM) device in accordance with some embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Disclosed herein are devices, methods, and techniques for self-repair of static random access memory (SRAM) devices used in a sequential SRAM configuration. SRAM devices configured for sequential memory access operations perform memory access operations (e.g., read operations and/or write operations) on a sequence of columns associated with one row by asserting a word line associated with the row and performing the memory access operations, sequentially, on the columns during assertion of the word line. In other words, unlike conventional SRAM memory access operations, the word line is held in the asserted state during a series of bit cell accesses, each associated with a column, rather than asserting and de-asserting the word line for each access. The techniques described herein take advantage of the sequential burst access of columns within a row implemented in sequential SRAM to repair bit cells that are faulty (generally referred to herein as "functional failures") and/or that are associated with bit lines that are relatively slow (e.g., relative to other bit lines of the SRAM device), for example, to develop a voltage difference (generally referred to herein as "parametric failures"). An overview of sequential SRAM operations are described below in connection with FIGS. 1A and 1B.

In some embodiments, an order in which local columns are accessed is rearranged to allow local columns associated with relatively slower bit lines to be accessed last in a sequential read operation, as shown in and described below in connection with FIGS. 2, 3A, 3B, and 4. In some embodiments, a repaired address that corresponds to a redundant column is identified such that the redundant column is selected during a sequential series of operations, as shown in and described below in connection with FIGS. 5-7. Identification of the repaired address may be performed during a time in which initialization operations are performed for sequential SRAM operations. In some embodiments, a memory access operation is delayed and/or the latency of the memory access operation is extended to allow time for slower bit lines to develop a voltage difference and/or drive current.

A static random access memory (SRAM) device includes a bit cell array arranged as a set of rows and a set of columns. The set of columns may be arranged as a set of column groups, where each column group includes a set of local columns. Each bit cell may be operatively coupled to a bit line pair (generally referred to herein as lbl and lblb). Each row may be operatively coupled to a word line. When accessing (whether as part of a read operation or as part of a write operation) a particular bit cell of the array, a row decoder is provided a row address, and the row decoder may be configured to activate (e.g., assert) the word line corresponding to the row address. During an operation, a column decoder associated with a particular column group may be configured to select, using a column multiplexer, a particular local column within the column group. The column multiplexer may select the pair of local bit lines, which are then operatively coupled to a data line pair in order to perform an operation. For example, in a read operation, a read/write circuit of the column multiplexer may sense the voltage on the bit line pair, which may then be transmitted to one or more interface circuits. As another example, in a write operation, a the read/write circuit drives the pair of bit lines to store a data value in the corresponding bit cell.

FIG. 1A shows a schematic diagram of an implementation of an SRAM device 100 in accordance with some embodiments. As illustrated, SRAM device 100 has a bit cell array 102. Bit cell array 102 includes 16 rows. The rows of bit cell array 102 may be accessed by a row decoder 103. For example, row decoder 103 may take, as an input, a 4-bit row address that identifies a row of the 16 rows. Bit cell array 102 additionally includes five column groups, 104, 106, 108, 110, and 112. Each column group is associated with a column decoder. For example, column group 104 is associated with column decoder 114, column group 106 is associated with column decoder 116, column group 108 is associated with column decoder 118, column group 110 is associated with column decoder 120, and column group 112 is associated with column decoder 122. Each column group of bit cell array 102 includes four local columns. Each column decoder may include a column multiplexer (not shown) that selects a particular local column of the column group. The column multiplexer may operatively couple a bit line pair of the selected local column to a data line associated with the column decoder (e.g., one of data lines 124, 126, 128, 130, or 132). For bit cell array 102 of FIG. 1A, a column decoder may take, as an input, a 2 bit column address that identifies one of the four local columns.

With conventional SRAM devices, a word line corresponding to a particular row is asserted and de-asserted within a single clock cycle. In other words, when multiple bit cells associated with different columns and the same row are accessed sequentially, the word line is asserted and de-asserted for each access within the same row. Switching of the word line consumes power, which is problematic for devices requiring low-power. Moreover, switching of the word line requires extra time due to switching transitions, thereby necessitating slower clock periods.

Sequential SRAM utilizes sequential accesses of bit cells within the same row to reduce power and to minimize switching transitions. With sequential SRAM, a word line associated with a particular row is asserted, and is held in an asserted state during accesses of multiple bit cells (e.g., corresponding to different local columns) of the row. Moreover, the bit lines associated with the multiple bit cells are pre-charged and held in a pre-charged state over multiple clock cycles corresponding to the multiple accesses.

Figure 1B:
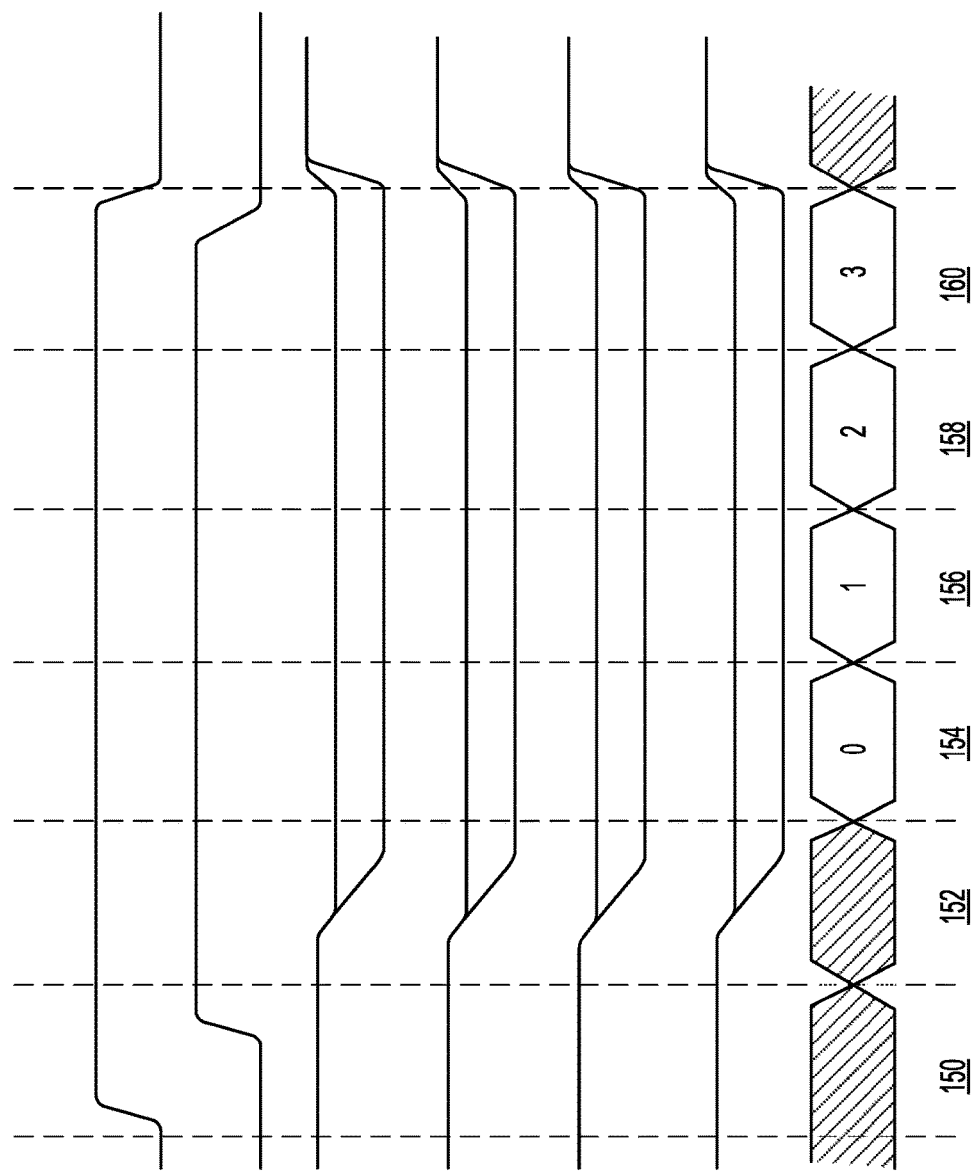
FIG. 1B is an example timing diagram that illustrates sequential memory operations using a sequential SRAM device in accordance with some embodiments.

FIG. 1B shows an example timing diagram for utilizing the SRAM device shown in FIG. 1A with sequential SRAM. As illustrated, during a first clock cycle 150, bit lines associated with local columns of a particular column group are pre-charged. Additionally, during first clock cycle 150, a word line associated with a particular row is asserted. During a second clock cycle 152, the bit lines develop a voltage difference. During the third, fourth, fifth, and sixth clock cycles (clock cycles 154-160, respectively), words (e.g., bit cells) are accessed from local columns 0-3, respectively. During access of each word, the word line remains asserted, and the pre-charge state is maintained. The word line is de-asserted and the pre-charge state is disabled after the last bit cell of the column group has been accessed (e.g., after the last column of the column group has been selected).

Relative to conventional SRAM, sequential SRAM distributes memory accesses over more clock cycles. For example, in conventional SRAM, each clock cycle may be associated with a memory access, whereas, referring to the example shown in and described above in connection with FIG. 1B, four memory accesses occur over six clock cycles. In particular, two clock cycles are utilized for initialization prior to the memory accesses (e.g., asserting the word line and pre-charging the bit lines of the local columns to be selected). While the effective data accessed per cycle is lower with sequential SRAM than with conventional SRAM, because sequential SRAM operation does not require switching every clock cycle (e.g., to assert and de-assert the word line for every memory access), the overall device speed may be faster with sequential SRAM than conventional SRAM due to the reduced switching overhead. Moreover, in some embodiments, the slower data access per cycle of sequential SRAM may be advantageously utilized to implement the repair techniques described herein. For example, in some implementations, the initialization phase may be utilized to identify a repaired bit cell (e.g., stored in a redundant column) that replaces a faulty bit cell by allowing time to identify the address of the repaired bit cell (e.g., by accessing a look up table (LUT), as described below in connection with FIGS. 5-7). As another example, in some embodiments, the handshaking protocol used in sequential SRAM to coordinate timing of memory accesses and implement row strides and/or column strides when sequentially accessing bit cells may be utilized to coordinate a delay of a memory operation in a series of sequential memory access operations. More particularly, the delay may allow slower bit lines time to develop a voltage difference without slowing down operation of the entire SRAM device, as shown in and described below in connection with FIGS. 8A, 8B, and 9.

In some instances, a bit line may discharge slowly and/or take longer to develop a voltage difference, for example, due to manufacturing variations. In conventional sequential SRAM operation, the entire SRAM device is operated at a slower clock speed to accommodate a slow bit line. As described herein, in some embodiments, local columns may be selected in an order that is based at least in part on speed information associated with one or more bit lines. In other words, in some embodiments, local columns are selected in a rearranged sequential order that is different than a physical sequential order of the local columns, where the rearranged sequential order is based at least in part on speed information. For example, in some embodiments, local columns associated with relatively faster bit lines may be selected before local columns that associated with relatively slower bit lines, thereby allowing the relatively slower bit lines time to discharge and/or develop a voltage difference. By rearranging a column selection order, an overall faster SRAM device speed can be achieved relative to conventional sequential SRAM techniques, thereby ameliorating parametric failures of the SRAM device. Re-ordering column selection order may address parametric failures associated with slower bit lines, and, by allowing for an overall faster SRAM device speed while addressing the parametric failures, overall parametric yield of the SRAM device may be increased. It should be noted that slower bit lines (sometimes referred to herein as "high variation columns") may be identified during testing of the SRAM device such that rearranging column selection order is configured after the testing and usable during operation of the SRAM device.

Figure 2:
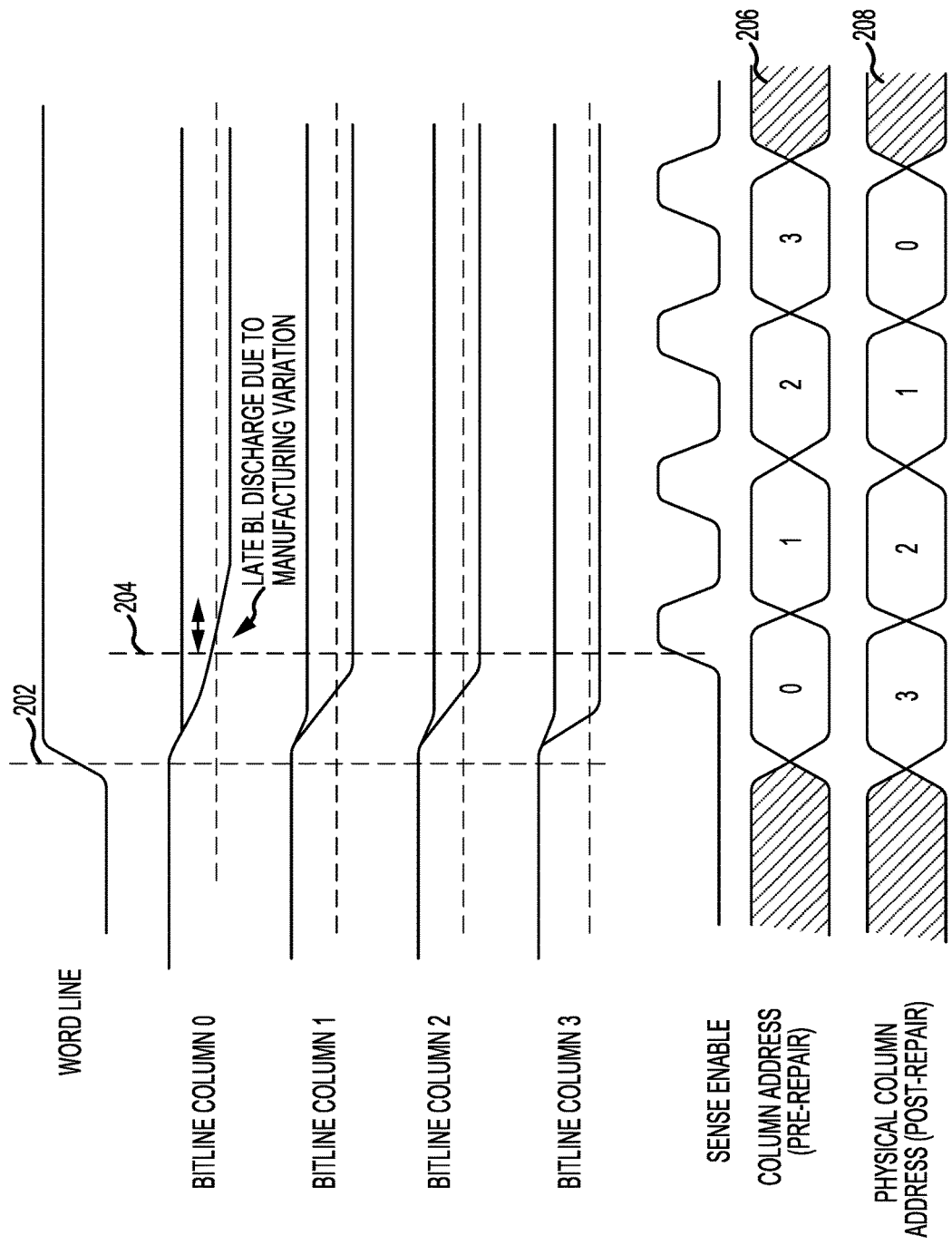
FIG. 2 is an example timing diagram that illustrates sequential column re-mapping in accordance with some embodiments.

FIG. 2 shows an example timing diagram for re-ordering column selection based on bit line speed in accordance with some embodiments. At time point 202, a word line associated with a particular row is asserted. By time point 204, bit lines associated with local columns 1, 2, and 3 have developed a sufficient voltage difference to be accessed. However, bit lines associated with local column 0 has not yet developed a sufficient voltage difference. In other words, bit lines associated with local column 0 can be considered "weak," or "slow." As illustrated by access order 206, the local columns would typically be selected in a sequential order of "0," "1," "2," and "3" (e.g., the physical sequential order of the local columns). However, as illustrated by access order 208, responsive to information indicating that bit lines associated with local column 0 is weak or slow, the local columns may be selected in an order that places local column 0 last, such as "3," "2," "1," and "0," thereby allowing the bit lines associated with local column 0 additional time to discharge.

In some embodiments, a column decoder associated with a column group is configured to modify an order in which local columns of the column group are selected. The column group may modify the order based at least in part on a repair signal that is generated based on information indicative of speeds of bit lines associated with the local columns. For example, a repair signal may be a binary signal that indicates whether the column group includes a slow or weak bit line. In some embodiments, the column decoder may provide the ordering to a column multiplexer which is configured to select the local columns in an order indicated by the column decoder.

Figure 3A:
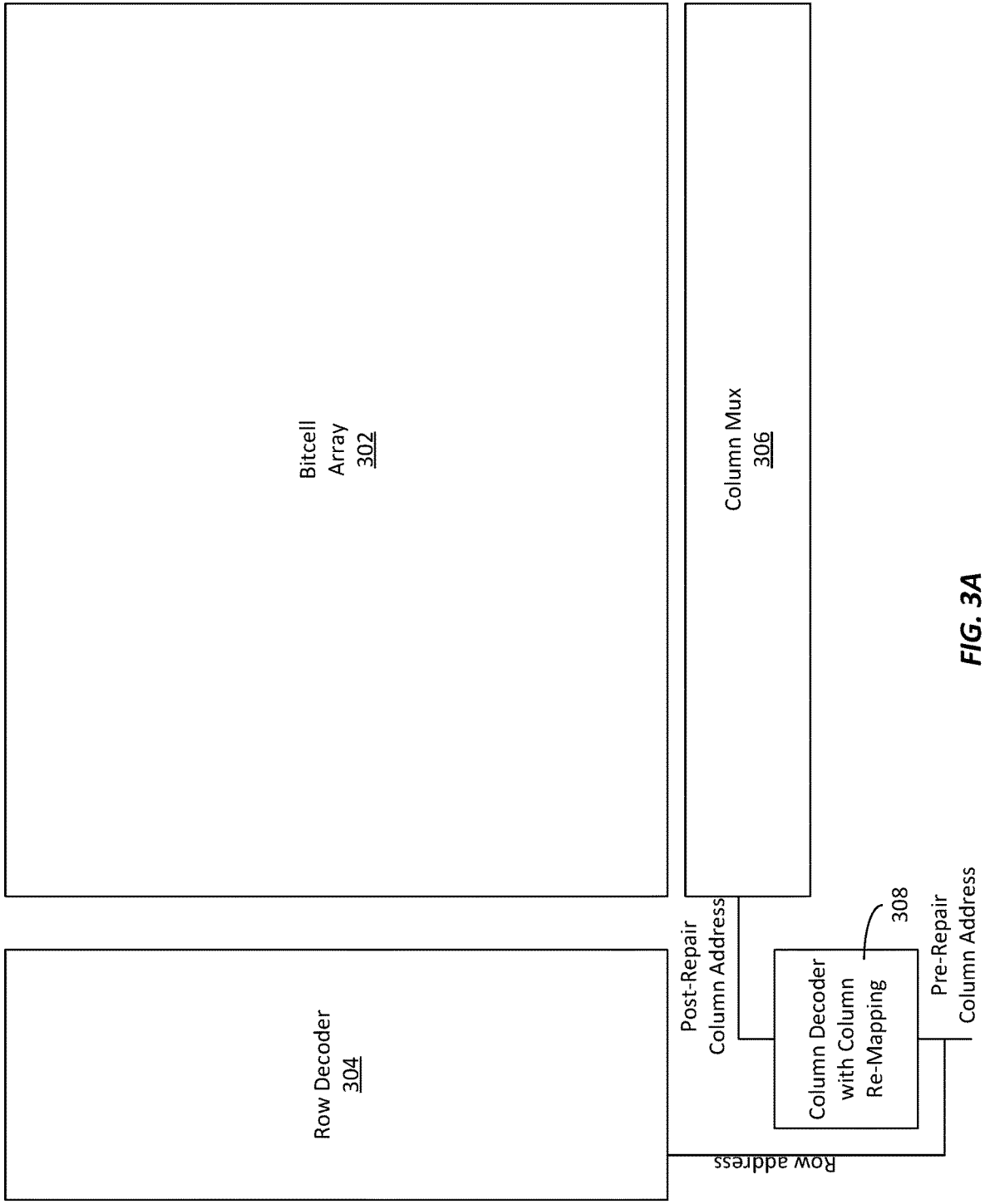
FIGS. 3A and 3B are schematic diagrams illustrating example implementations of sequential column re-mapping in accordance with some embodiments.

FIG. 3A shows a schematic diagram for an implementation of a column decoder with column re-mapping. As illustrated, a bit cell array 302 is accessed using a row decoder 304, and one or more column multiplexers 306, that each select local columns of a particular column group. For example, row decoder 304 may be configured to receive a row address (e.g., N bits that identify one of $2^N$ rows) and assert a word line corresponding to the row address. Column multiplexer 306 is associated with a column decoder 308. For example, column multiplexer 306 may be operatively coupled to column decoder 308 and/or receive signals from column decoder 308. As illustrated, column decoder 308 may take, as an input, a pre-repair column address (e.g., M bits that identify one of $2^M$ local columns). Column decoder 308 may additionally take as an input a repair signal that indicates whether or not an order in which the local columns are selected is to be modified. Column decoder 308 may then generate post-repair column addresses that are generated based at least in part on the repair signal. For example, in an instance in which the repair signal indicates that no column selection re-ordering is necessary, the post-repair column addresses may be the same as the pre-repair column addresses. Conversely, in an instance in which the repair signal indicates that column selection re-ordering is to be performed, the post-repair column addresses may be different than the pre-repair column addresses. Effectively, column decoder 308 may re-map logical and physical column addresses based on the repair signal such that physical column addresses associated with relatively slower bit lines are mapped to logical column addresses that would be selected earlier within a sequence.

In some embodiments, an order in which local columns are selected may be reversed responsive to speed information associated with bit lines of the local columns. For example, in an instance in which the speed information indicates that a local column that is ordinarily selected in a first half of the sequential ordering is associated with a relatively slow bit line, the speed information may be used to generate a repair signal which causes a selection ordering of the local columns to be reversed. By way of example, in an instance in which the local columns are generally selected in an order of "0," "1," "2," and "3," the ordering may be reversed such that the local columns are selected in an order of "3," "2," "1," and "0." In some embodiments, selection order may be reversed by performing an "exclusive OR" (XOR) operation on a binary repair signal that indicates whether or not column re-ordering is to be performed with bits of the column address. For example, in an instance in which the repair signal is 1, and in which the 3-bit column address (which identifies one of 8 local columns) is 000, the XOR operation may be used to generate a repaired address of 111, thereby causing the eighth local column to be selected rather than the first local column.

Figure 3B:
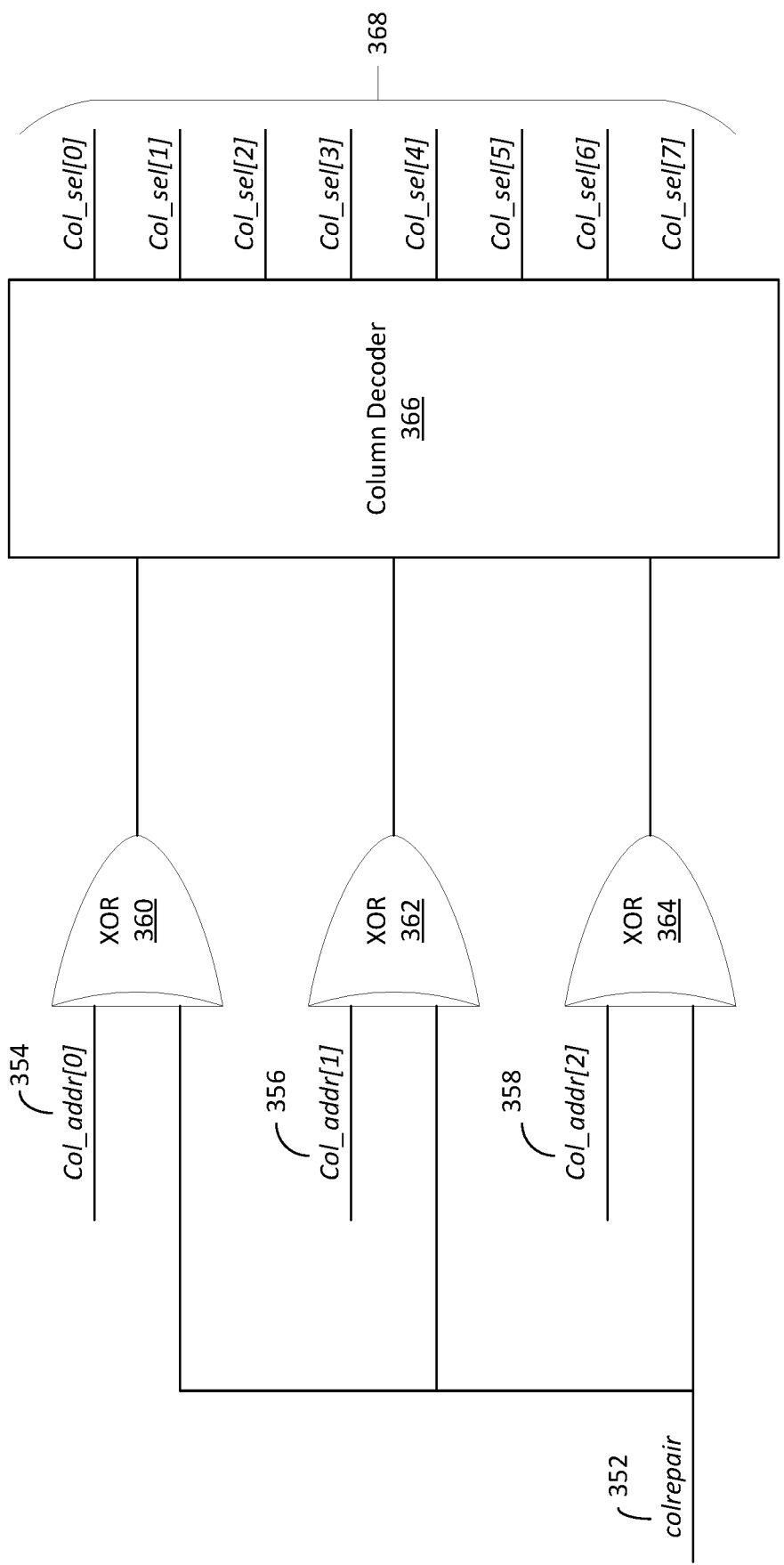

FIG. 3B shows a schematic diagram for implementation of sequential column re-mapping in accordance with some implementations. As illustrated, a column repair signal 352 indicates whether or not an order of selection of local columns is to be reversed. An XOR of column repair signal 352 is then performed with each bit of a local column address to be accessed. For example, XOR gate 360 performs an XOR operation with first bit 354 and column repair signal 352. As another example, XOR gate 362 performs an XOR operation with second bit 356 and column repair signal 362. As yet another example, XOR gate 364 performs an XOR operation with third bit 358 and column repair signal 352. The outputs of the XOR gates 360-364 are provided to column decoder 366, which generates a high signal on one of column selection lines 368 corresponding to the local column to be selected. By way of example, in an instance in which a pre-repair ordering of local columns is: 000, 001, 010, 011, 100, 101, 110, and 111, and in which the repair signal is 1, the post-repair ordering of local columns is: 111, 110, 101, 100, 011, 010, 001, and 000. Note that XOR gates 360-364 perform column remapping, and column decoder 366 performs column decoding based on the remapped columns.

Figure 4:
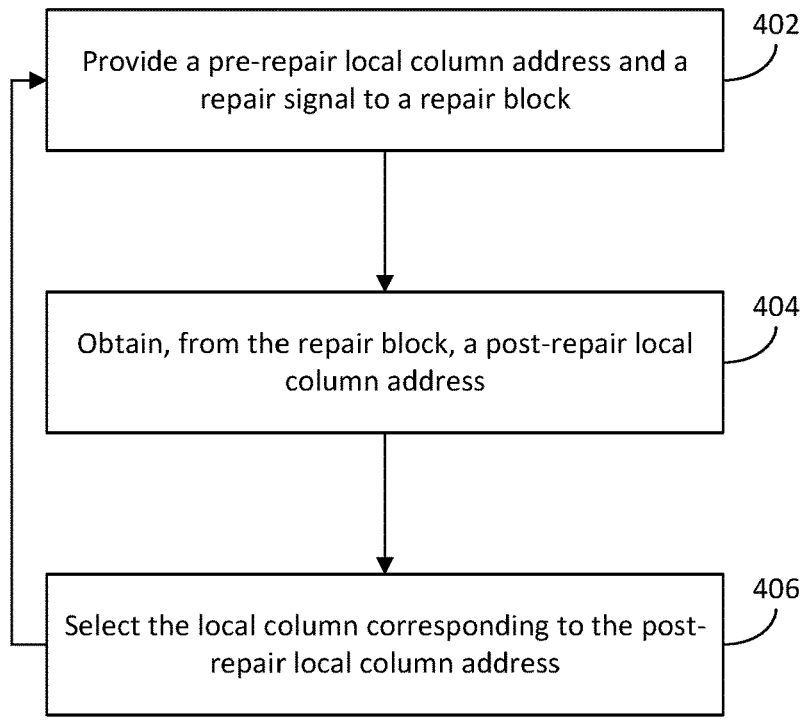
FIG. 4 is a flowchart that depicts an example process for sequential column re-mapping in accordance with some embodiments.

FIG. 4 shows an example of a process 400 for sequential re-mapping of local column accesses in accordance with some embodiments. In some embodiments, blocks of process 400 may be performed in an order other than what is shown in FIG. 4. In some embodiments, two or more blocks of process 400 may be performed substantially in parallel. In some embodiments, one or more blocks of process 400 may be omitted. In some embodiments, blocks of process 400 may be performed by a controller, such as a controller (e.g., a microcontroller) of a system on a chip (SOC) device that includes the SRAM device.

Process 400 can begin at block 402 by providing a pre-repair local column address and a repair signal to a repair block. The pre-repair local column address may be M bits that identify a local column of $2^M$ local columns of a column group. In some embodiments, the repair signal may be a binary signal that indicates whether or not the pre-repair local column address is to be mapped to a post-repair column address. In some embodiments, the repair signal may be generated based at least in part on information that indicates relative speeds of bit lines associated with the local columns. For example, the information may indicate that a particular local column is associated with a relatively slow or weak bit line. In some embodiments, the repair signal may be set as enabled responsive to the information indicating that a local column associated with a relatively slower or weaker bit line is typically selected earlier than other local columns (e.g., earlier than the majority of the other local columns). In some embodiments, the repair block may include a series of XOR gates each corresponding to one of the bits of the pre-repair local column address.

At block 404, process 400 can obtain, from the repair block, a post-repair local column address. For example, the post-repair local column address can be the pre-repair local column address with the bits of the address flipped. As a more particular example, in an instance in which the pre-repair local column address is 000, the post-repair local column address may be 111.

At block 406, process 400 can select the local column corresponding to the post-repair local column address. Process 400 can then loop back to block 402 and repeat blocks 402-406 until all local columns of the column group have been selected. Accordingly, based on the repair signal, the pre-repair local column addresses have been re-mapped to post-repair local column addresses such that the local columns are selected based on the information that indicates speed of the bit lines (e.g., to discharge and/or develop a voltage difference).

Conventional SRAM repair techniques address functional failures of a single faulty bit cell associated with a particular local column by including an entire redundant column group that effectively replaces the column group in which the local column having the faulty bit cell, or, by including a redundant column that effectively replaces the entire local column having the faulty bit cell. In other words, using conventional functional repair techniques, bit cells that are not faulty are replaced (e.g., by inclusion in a redundant column and/or in a redundant column group). Conventional techniques lead to increased device size. For example, using conventional techniques, a redundant column is utilized for each faulty bit cell. The increase in device size may itself by problematic (e.g., by requiring additional area on a SOC), and, increases leakage power.

As described herein, in some embodiments, an SRAM device on which sequential SRAM is implemented may have one or more redundant columns, where bit cells of a redundant column may correspond to different local columns. Bit cells of the redundant column(s) may be used to repair defective bit cells of the primary bit cell array, thereby ameliorating functional failures with a reduced device size and reduced leakage power relative to conventional techniques. Moreover, given a fixed SRAM device size (e.g., a fixed size dictated by space constraints of an SOC on which the SRAM device is included), more faulty bit cells can be repaired. In some embodiments, a redundant column may replace a local column of a particular column group. In some embodiments, a repair multiplexer may be used to select a redundant column of the redundant columns. In some embodiments, an address (e.g., a row identifier, a column group identifier, and a local column address) may be provided to a LUT to identify a redundant column of the one or more redundant columns which correspond to the address (e.g., associated with the faulty bit cell) to be repaired. The output of the LUT may then be used by the repair multiplexer to select the redundant column during the memory access rather than selecting the local column that includes the faulty bit cell. It should be noted that, in some embodiments, a LUT may be configured during testing of the SRAM device (e.g., during factory testing) after faulty bit cells have been identified, and then utilized during operation.

Figure 5:
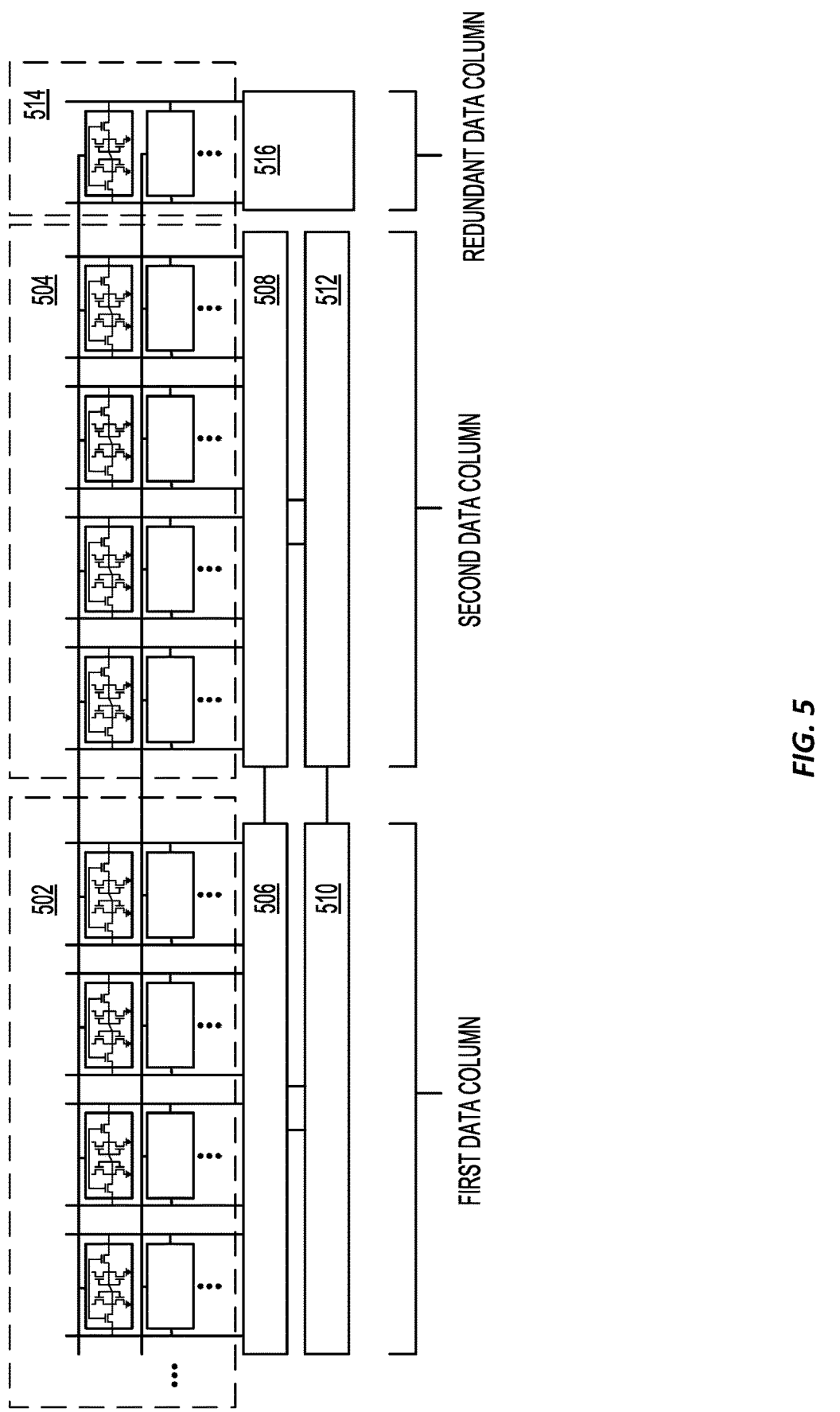
FIG. 5 is a schematic diagram that illustrates use of a redundant column with a sequential SRAM device in accordance with some embodiments.

FIG. 5 shows a schematic diagram of an example implementation of a redundant data column. As illustrated in FIG. 5, an SRAM device may have two column groups, 502 and 504. In the example shown in FIG. 5, each column group includes four local columns. The local columns within a column group may be selected by a column multiplexer. For example, column multiplexer 506 selects local columns within column group 502, and column multiplexer 508 selects local columns within column group 504. Column multiplexers 506 and 508 are operatively coupled to read/write circuitry 510 and 512, respectively. The SRAM device additionally includes a redundant column 514. Redundant column 514 is operatively coupled to read/write circuitry 516. to allow bit cells of the redundant column to be accessed (e.g., to perform a read operation and/or a write operation). Redundant column 514 include bit cells that replace faulty bit cells from any local column in column group 502 or columns group 504. For example, a first repaired bit cell at a first row of redundant column 514 may replace a first faulty bit cell in a first row of any local column of column group 502 or column group 504. Continuing with this example, a second repaired bit cell at a second row of redundant column 514 may replace a second faulty bit cell in a second row of any local column of column group 502 or column group 504. Continuing still further with this example, in some embodiments, the first faulty bit cell may be associated with a different local column than the second faulty bit cell.

Figure 6:
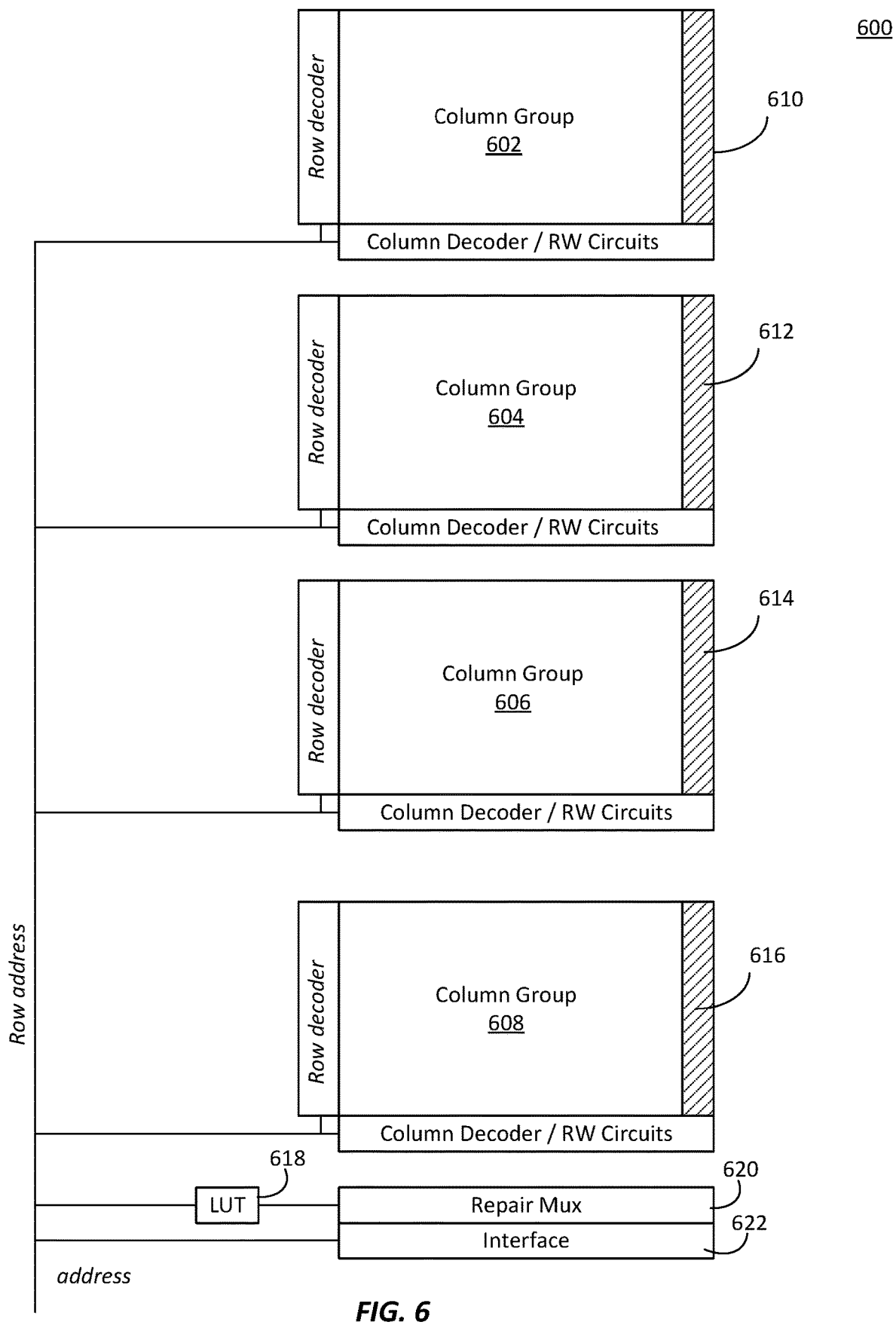
FIG. 6 is a schematic diagram of a system for implementing address dependent repair in accordance with some embodiments.

FIG. 6 shows a schematic diagram of an example SRAM device 600 that utilizes a LUT to address bit cells of a redundant column in accordance with some embodiments. As illustrated, SRAM device 600 includes four column groups 602, 604, 606 and 608. Although not shown in FIG. 6, each column group includes a set of local columns that may be selected by a corresponding column decoder. Read and write operations may be performed by read/write circuitry associated with each column group. Additionally, each column group is associated with a redundant column. For example, column group 602 is associated with a redundant column 610, column group 604 is associated with a redundant column 612, column group 606 is associated with a redundant column 614, and column group 608 is associated with a redundant column 616. A redundant column may include repaired bit cells, each repaired bit cell corresponding to a faulty bit cell. Repaired bit cells within a particular redundant column may correspond to different local columns. In some embodiments, a row associated with a repaired bit cell is the same as a row associated with the corresponding faulty bit cell. A row decoder is used to select the row associated with a row address (e.g., by causing a word line corresponding to the selected row to be asserted).

In some embodiments, an address is provided to a LUT 618, which maps the address to a repaired address. For example, the address may include a row address, a column group identifier, and a local column identifier, and LUT 618 then identifies a column that corresponds to the row address, the column group identifier, and the local column identifier. As a more particular example, in an instance in which the address provided to LUT 618 corresponds to a faulty bit cell, LUT 618 identifies a repaired address associated with a redundant column that includes a repaired bit cell corresponding to the faulty bit cell. In some embodiments, the repaired address is associated with the same row as the row of the faulty bit cell. The output of LUT 618 (e.g., the repaired address) is then provided to a repair multiplexer 620, which selects the redundant column during a memory access operation (e.g., a read operation or a write operation). Data may be stored and/or provided via a corresponding interface 622. It should be noted that, as used herein, a repaired address may refer to a control signal utilized by a repair multiplexer (e.g., repair multiplexer 620) to select a particular redundant column that includes a repaired bit cell that replaces a corresponding faulty bit cell.

Figure 7:
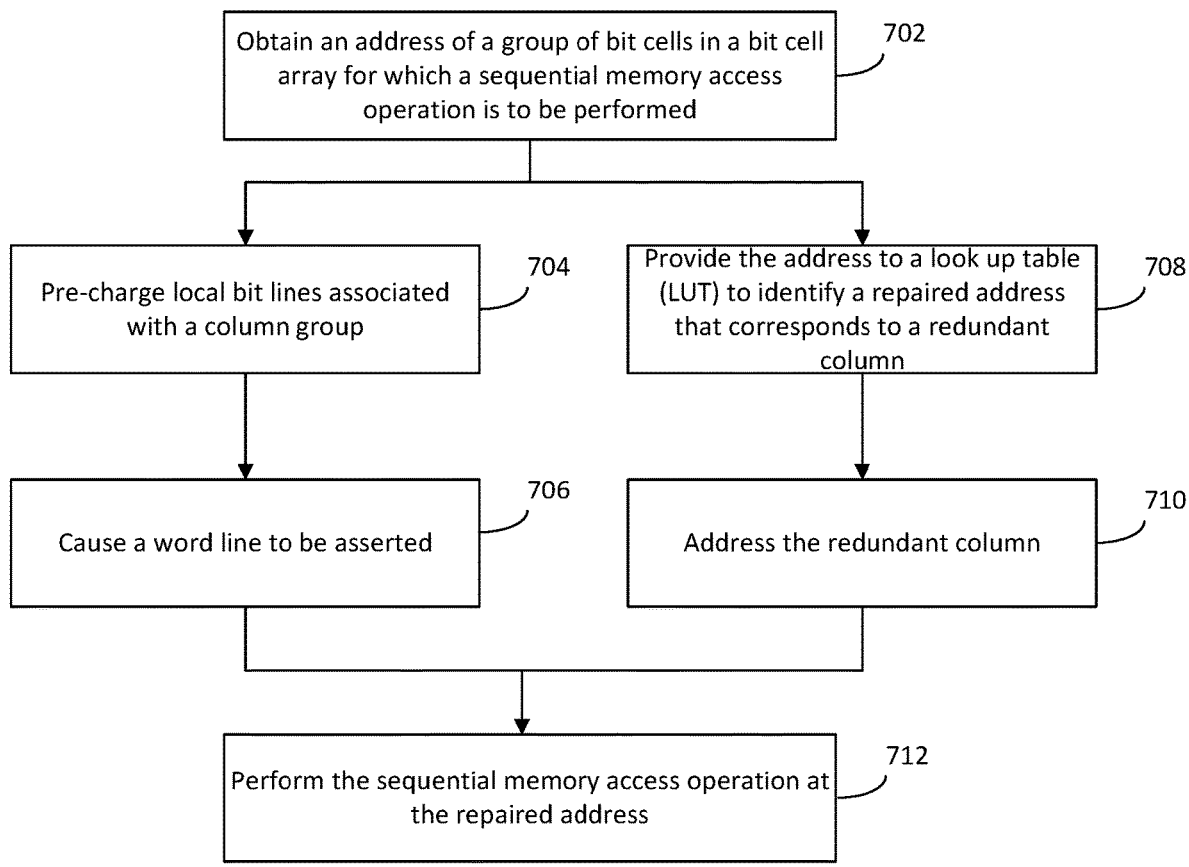
FIG. 7 is a flowchart that depicts an example process for address dependent repair in accordance with some embodiments.

FIG. 7 shows an example of a process 700 for utilizing redundant columns in accordance with some embodiments. In some embodiments, blocks of process 700 may be executed by a controller that controls operations of an SRAM device, such as a controller of a SOC that also includes the SRAM device. In some embodiments, blocks of process 700 may be executed in an order other than what is shown in FIG. 7. In some embodiments, one or more blocks of process 700 may be omitted. In some embodiments, two or more blocks of process 700 may be performed substantially in parallel.

At block 702, process 700 can obtain an address of a group of bit cells in a bit cell array for which a sequential memory access operation is to be performed. The address information may include a row address corresponding to a particular row of a bit cell array, a column group identifier that identifies a particular column group of the bit cell array, and a local column identifier that identifies a particular local column of the column group corresponding to the column group identifier. It should be noted that the bit cell array may include one or more redundant columns that are each configured to store one or more repaired bit cells that replace corresponding faulty bit cells. In some embodiments, within a redundant column, repaired bit cells may correspond to different local columns and/or different column groups. For example, a first repaired bit cell of a redundant column may be associated with a first faulty bit cell of a first local column, and a second repaired bit cell of the redundant column may be associated with a second faulty bit cell of a second local column, wherein the first local column and the second column are different. Moreover, the first local column and the second local column may be associated with different column groups. In some embodiments, a repaired bit cell may be associated with the same row as the corresponding faulty bit cell. For example, in an instance in which a faulty bit cell is at row 1, the repaired bit cell may be in a redundant column at row 1.

At block 704, process 700 can pre-charge local bit lines associated with the column group corresponding to the column group identifier. As described above, pre-charging the local bit lines may allow the local columns of the column group to be conditioned prior to a sequential memory access operation. Pre-charging the local bit lines may be considered part of an initialization phase for a series of sequential memory access operations, where the initialization phase is unique to sequential SRAM operation relative to conventional SRAM operation, as described above in connection with FIG. 2.

At block 706, process 700 can cause a word line to be asserted. The word line may correspond to the row associated with the row address. Assertion of the word line may be considered part of the initialization phase for the series of sequential memory access operations, where the initialization phase is unique to sequential SRAM operation relative to conventional SRAM operation, as described above in connection with FIG. 2.

Identification of a repaired address corresponding to the address obtained at block 702 occurs at blocks 708 and 710. It should be noted that blocks 708 and 710 may be performed substantially in parallel with blocks 702 and 704. That is, blocks 708 and/or 710 may occur concurrently with pre-charging local bit lines at block 704 and/or with asserting a word line at block 710. In other words, blocks 708 and 710 may occur during the initialization phase that is unique to sequential SRAM operation relative to conventional SRAM operation, thereby allowing identification of the repaired address to occur during the initialization phase.

At block 708, process 700 can provide the address of the bit cell to a LUT to identify a repaired address that corresponds to a redundant column of the bit cell array. The repaired address may indicate a column address of the redundant column that is to be selected to address the repaired address. In some embodiments, the repaired address may be a control signal that causes the redundant column to be selected rather than causing a local column corresponding to the local column identifier to be selected. In some implementations, the LUT may be stored in memory associated with a controller executing process 700.

At block 710, process 700 can address the redundant column. For example, process 700 can use a repair multiplexer to select the redundant column rather than selecting the local column associated with the address (e.g., the pre-repair address) obtained at block 702.

At block 712, process 700 can perform the memory access operations at the repaired address. For example, in an instance in which the sequential memory access operation is a read operation, process 700 can activate sensing circuitry of a read/write circuit that causes a voltage difference on a pair of bit lines associated with the redundant column to be sensed and/or recorded as a data value. As another example, in an instance in which the sequential memory access operation is a write operation, process 700 can activate drive circuitry that drives the pair of bit lines associated with the redundant columns to store a value in the repaired bit cell associated with the repaired address.

In some embodiments, process 700 can then proceed to perform a subsequent sequential memory access operation by accessing a bit cell associated with the same row and a different local column of the column group. Process 700 may then loop through local columns of the column group. After looping through the local columns of the column group, process 700 may cause the word line to be de-asserted. By way of example, in an instance in which row 1 is being accessed, and in which a faulty bit cell is located at row 1, column 3, process 700 may assert the word line corresponding to row 1, and then access column 1, column 2, a redundant column identified using the LUT, and column 4, and then de-asserting the word line corresponding to row 1. It should be noted that, in some embodiments, for a particular row access, the redundant column may be selected only once. In other words, in some embodiments, while a redundant column may store repaired bit cells corresponding to faulty bit cells of different local columns, a row address between the faulty bit cell and the corresponding repaired bit cell may be preserved.

It should be noted that by performing blocks 708 and 710 substantially in parallel with blocks 704 and 706, process 700 can take advantage of the time needed to pre-charge the local bit lines (at block 704) and cause the word line to be asserted (at block 706) to identify the repaired address and address the redundant column associated with the repaired address. In other words, because the pre-charging of local bit lines during a burst of sequential memory access operations requires additional time when utilizing a sequential SRAM device relative to a conventional SRAM device, the use of a look up table to identify specific redundant columns may take advantage of the required additional time, thereby reducing SRAM device overhead. By allowing for time to identify redundant columns, individual faulty bit cells may be replaced from multiple different local columns rather than replacing an entire column due to one faulty bit cell, thereby addressing functional failures while reducing device overhead.

In some embodiments, a parametric yield of an SRAM device may be improved by modifying a latency for performing a memory access operation on a local column associated with a slow access time while maintaining latency for performing memory access operations on local columns with faster access times. In other words, rather than slowing down sequential memory access operations across the entire SRAM device to accommodate the slowest local columns, the slowest local columns may be afforded extra latency to perform memory access operations, which may allow an overall increase in SRAM device speed. It should be noted that slower local columns may be identified during SRAM device testing (e.g., factory testing). Use of delay periods for the identified slower local columns may then be hard-wired or hard-coded for use during operation of the SRAM device. In other words, slower local columns do not need to be identified during operation of the SRAM device.

It should be noted that sequential SRAM operation typically requires a handshaking protocol to coordinate timing of the sequential memory access operations. For example, the handshaking protocol may be used to accommodate various row strides and/or column strides in which adjacent rows or columns are not selected, but rather, every Nth row or column is selected. The techniques described herein for increasing latency to perform particular memory access operations (e.g., for those associated with relatively slower bit lines) may take advantage of the handshaking protocol. For example, in some embodiments, delay of a particular memory access operation may be coordinate using the handshaking protocol. As a more particular example, in some embodiments, a stall signal which causes the delay may be enabled and/or disabled using the handshaking protocol. By utilizing the handshaking protocol already required by sequential SRAM, parametric yield of the SRAM device may be improved with relatively little extra overhead.

In some embodiments, a local column associated with bit lines that are relatively slower to develop a voltage difference may be afforded extra time to develop a voltage difference by extending an initialization phase associated with performing sequential memory access operations on a particular row. In a particular, bit lines corresponding to local columns may be pre-charged for an extra duration of time (e.g., an extra one or more clock cycles) to allow the slower bit lines additional time to develop a voltage difference. A series of sequential read operations may then be performed by selecting local columns in a sequential order. In some embodiments, the one or more extra clock cycles of the initialization phase may be triggered by a stall signal. The stall signal may be generated responsive to determining that at least one bit line is relatively slow to develop a voltage difference (e.g., slow relative to other bit lines of the SRAM device).

Figure 8A:
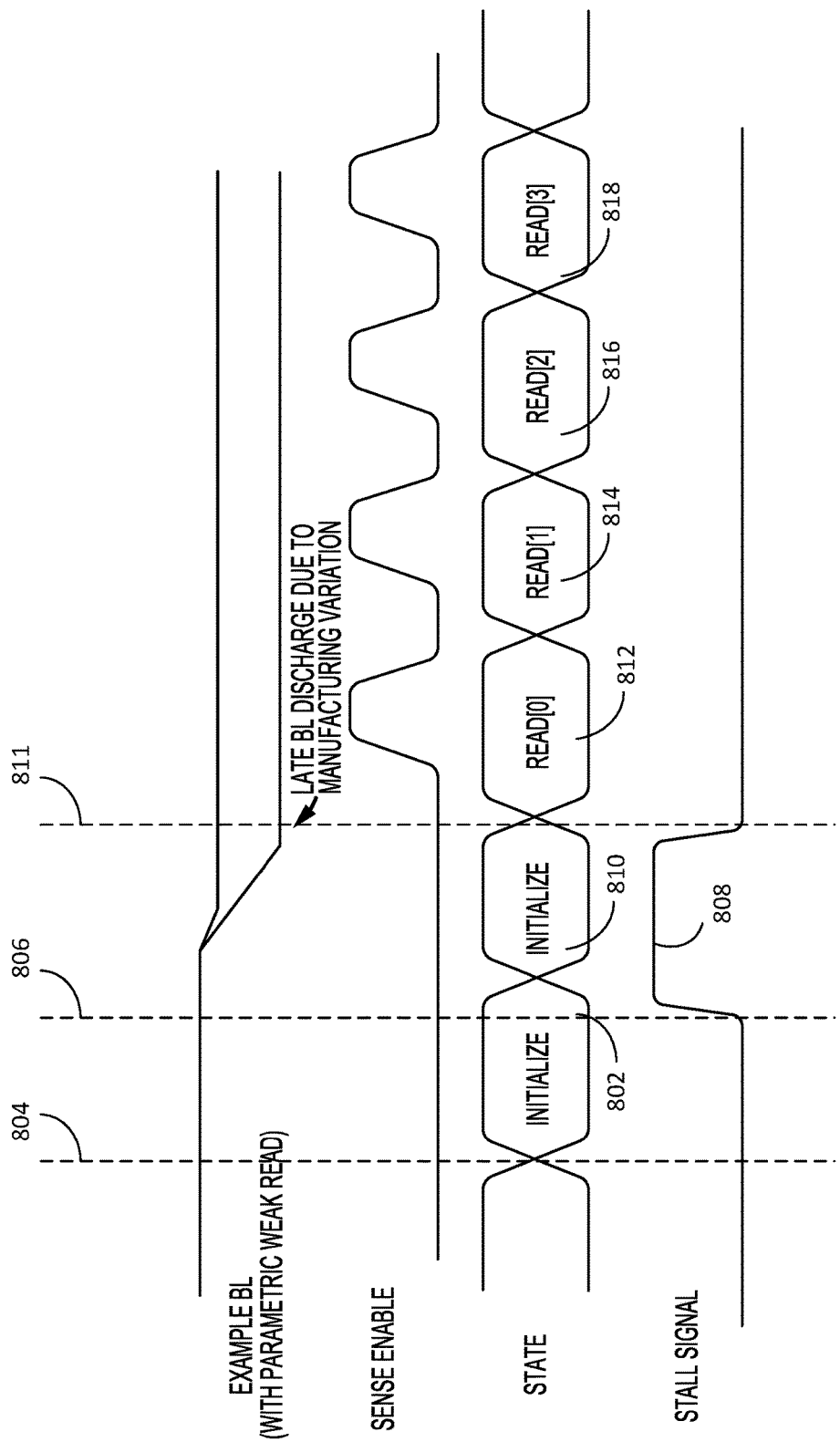
FIGS. 8A and 8B are example timing diagrams for multi-cycle repair operations in accordance with some embodiments.

FIG. 8A shows an example timing diagram for performing read operations with an extended latency in accordance with some embodiments. As illustrated, a first initialization phase 802 is begun at time 804. The first initialization phase may correspond to pre-charging bit lines associated with a set of local columns and/or asserting a word line of a particular row. At time 806, a stall signal 808 is set to an enabled state. Stall signal 808 may be set to the enabled state responsive to information indicating that a particular bit line associated with the set of local columns is associated with a relatively longer time to develop a voltage difference than other bit lines of the SRAM device (e.g., other local columns associated with other column groups than the column group the set of local columns is associated with). The enabled state of stall signal 808 triggers a second initialization phase 810. Second initialization phase 810 may correspond to the pre-charging of the bit lines for an extended duration of time, e.g., for an extra one or more clock cycles. At 811, stall signal 808 is disabled. Responsive to stall signal 808 being disabled, at 812, 814, 816, and 818, a series of read operations are performed by sequentially selecting columns 0, 1, 2, and 3, respectively. Note that, as illustrated in FIG. 8, the entire series of read operations for the set of local columns is delayed due to the enablement of stall signal 808. In some embodiments, the delay may correspond to one cycle.

In some embodiments, a bit cell associated with a bit line that is relatively slower may be afforded extra time during a write operation by causing the bit line to be driven for an extra period of time (e.g., one or more extra clock cycles) during the write operation. In some embodiments, the one or more extra clock cycles may be triggered by a stall signal. The stall signal may be generated responsive to determining that at least one bit line is relatively slow to develop a voltage difference (e.g., slow relative to other bit lines of the SRAM device).

Figure 8B:
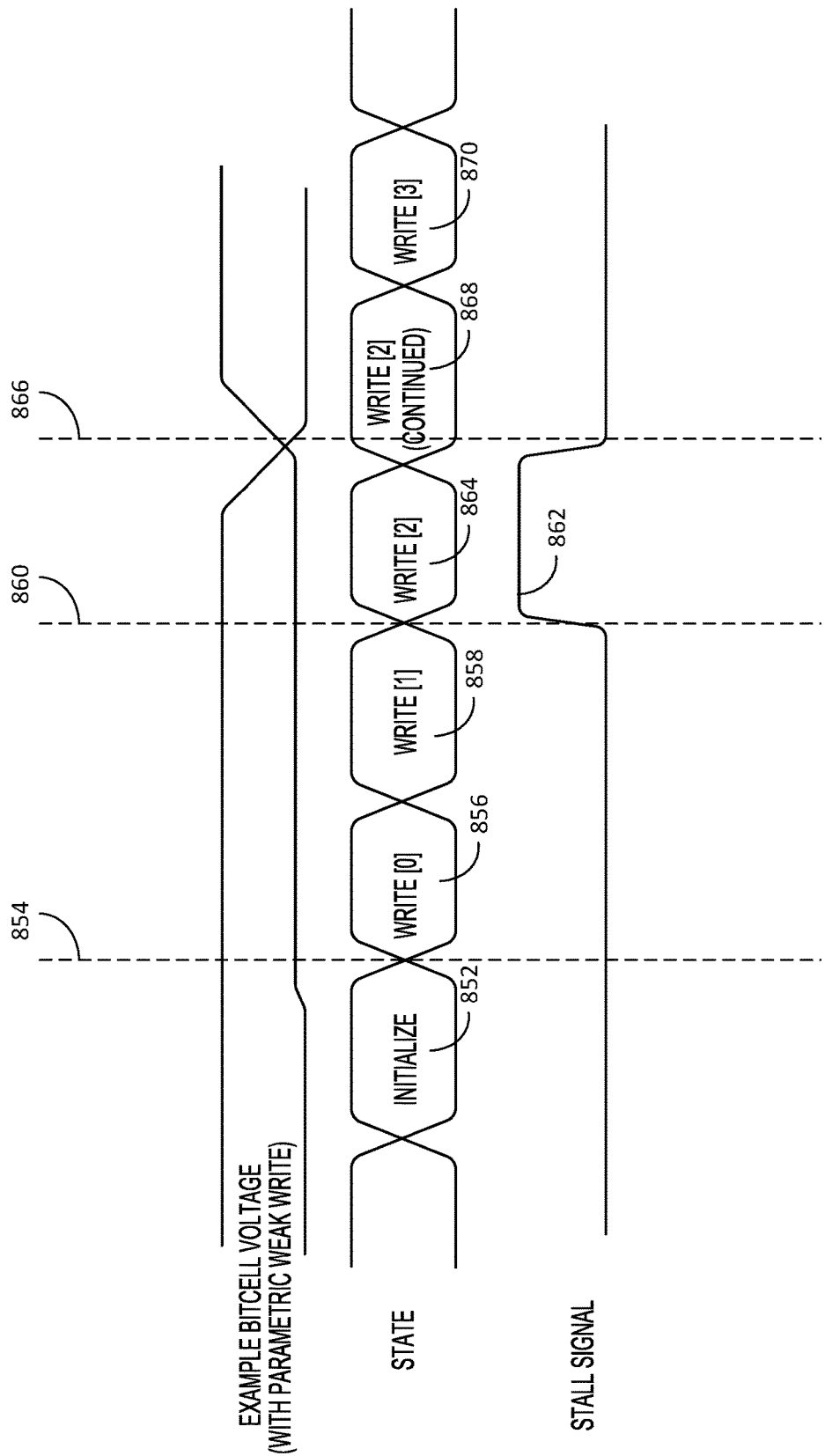

FIG. 8B shows an example timing diagram for performing write operations with an extended latency in accordance with some embodiments. In the example shown in FIG. 8B, the bit line that is relatively slower is the bit line corresponding to local column 2. An initialization phase 852 occurs. Initialization phase 852 may include pre-charging the bit lines corresponding to the local columns of a column group and/or asserting a word line corresponding to a row at which the write operation is to be performed. At time 854, a series of write operations begins. At 856, local column 0 is selected and a write operation is performed on a bit cell corresponding to local column 0. Similarly, at 858, local column 1 is selected, and a write operation is performed on a bit cell corresponding to local column 1. At 860, a write operation is performed on a bit cell corresponding to local column 2. Concurrently with the write operation at 864, a stall signal 862 is enabled responsive to information that indicates that the local column (e.g., local column 2) is associated with a relatively slower bit line. At time 866, the stall signal is disabled. However, responsive to the stall signal having been enabled during the write operation at 864, at 868, an extra write cycle is performed on the bit cell corresponding to local column 2. In other words, the column drivers are driven for an extra time period (corresponding to a number of clock cycles over which the stall signal was enabled) during which local column 2 is selected. At 870, a write operation is performed on a bit cell corresponding to local column 3. Note that, only the write operation associated with local column 3 was delayed due to the stall signal.

Figure 9:
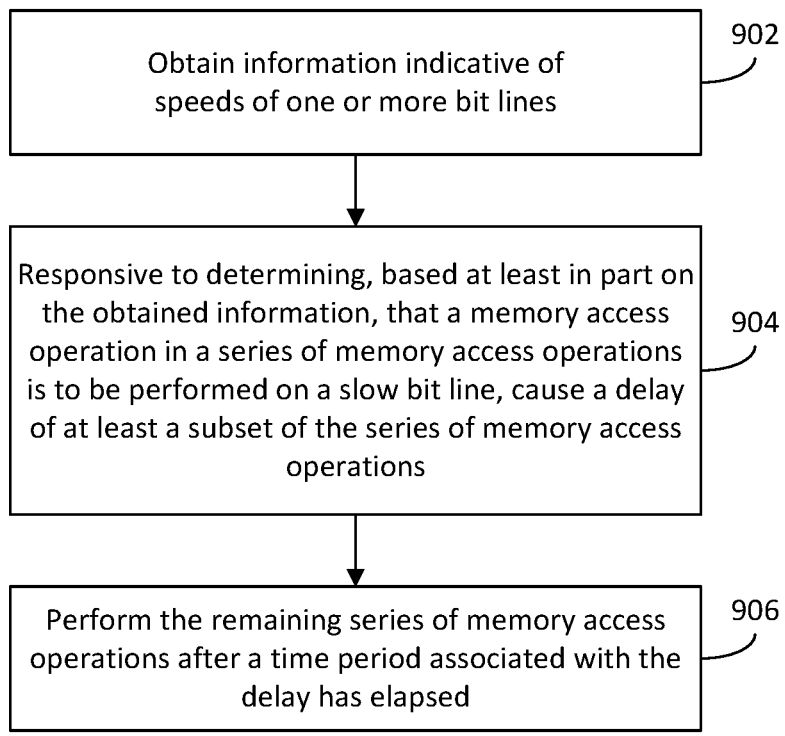
FIG. 9 is a flowchart that depicts an example process for multi-cycle repair operations in accordance with some embodiments.

FIG. 9 shows an example of a process 900 for performing sequential memory access operations with extended latency in accordance with some embodiments. Blocks of process 900 may be executed by a controller that controls timing and other operations of an SRAM device. In some embodiments, blocks of process 900 may be performed in an order other than what is shown in FIG. 9. In some embodiments, two or more blocks of process 900 may be performed substantially in parallel. In some embodiments, one or more blocks of process 900 may be omitted. In some implementations, blocks of process 900 may be executed by a controller, such as a controller of a SOC that includes the SRAM device.

At 902, process 900 can obtain information indicative of speeds of one or more bit lines. The information may indicate that a particular bit line is slower to develop a voltage difference than other bit lines of the SRAM device (e.g., bit lines associated with other column groups). The information may indicate a particular column address associated with a slower bit line. It should be noted that the obtained information may not directly indicate speeds of the one or more bit lines. Rather, the obtained information may indicate that particular bit lines are to be accessed in connection with a delay, as described below in connection with blocks 904 and 906.

At block 904, responsive to determining, based at least in part on the obtained information, that a memory access operation in a series of sequential memory access operations is to be performed on a slow bit line, process 900 can cause a delay of at least a subset of the series of memory access operations. The delay may correspond to a time period of one or more clock cycles. In some embodiments, process 900 can cause the delay by enabling a stall signal. For example, in an instance in which the series of memory access operations is a series of read operations, the stall signal may be generated at the end of a first initialization phase in which a set of bit lines associated with a column group are pre-charged and/or in which a word line of a particular row is asserted, as illustrated in FIG. 8A. Continuing with this example, the stall signal may cause the entire series of read operations to be delayed by causing the initialization phase to be extended for one or more additional clock cycles.

As another example, in an instance in which the series of memory access operations is a series of write operations, the stall signal may be generated concurrently with a write operation associated with the slower bit line indicated in the information obtained at block 902, as illustrated in FIG. 8B. Continuing with this example, the stall signal may cause a remaining subset of memory write operations to be delayed until the slower bit line is driven for an additional one or more clock cycles. By way of example, in an instance in which the slow bit line corresponds to local column 2, and in which the sequential order in which the local columns are selected in 0, 1, 2, 3, selection of local columns 0 and 1 may not be delayed, whereas selection of local column 3 may be delayed due to an extended write operation associated with local column 2.

At block 906, process 900 can perform the remaining series of memory access operations after a time period associated with the delay has elapsed. In some embodiments, process 900 can perform the remaining series of memory access operations responsive to the stall signal being disabled. For example, in an instance in which the memory access operations are read operations, disabling the stall signal can cause the initialization phase to end, and the remaining series of read operations can include performing read accesses sequentially on all of the local columns of the column group. As another example, in an instance in which the memory access operations are write operations, disabling the stall signal can cause the extra write cycle(s) associated with the slow bit line to end, and can cause write operations to proceed to the next local column(s) in the column group. In some implementations, after performing the remaining series of memory access operations, process 900 can de-assert the word line.

It should be noted that, in some embodiments, any of the repair techniques described above in connection with FIGS. 2, 3A, 3B, 4, 5, 6, 7, 8A, 8B, and 9 may be combined. For example, the order in which local columns are selected may be modified, where the local columns include one or more redundant columns, thereby combining the sequential column re-mapping technique described above in connection with FIGS. 2-4 with the address-dependent repair technique described above in connection with FIGS. 5-7. As another example, the order in which local columns are selected may be modified, where an operation is performed with an extended latency in connection with one of the local columns, thereby combining the sequential column re-mapping technique described above in connection with FIGS. 2-4 with the extended latency repair technique described above in connection with FIGS. 8A, 8B, and 9. As yet another example, a memory access operation may be performed with extended latency in connection with use of a redundant column, thereby combining the address-dependent repair technique described above in connection with FIGS. 5-7 with the extended latency repair technique described above in connection with FIGS. 8A, 8B, and 9. As still another example, in some embodiments, the sequential column re-mapping repair technique, the address-dependent repair technique, and the extended latency repair technique may all be combined.

The integrated circuits described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

In some embodiments, the integrated circuits or integrated circuit packages described herein may be integrated into an HMD. For example, such an HMD may include one or more light emitters and/or one or more light sensors incorporated into a portion of a frame of the HMD such that light can be emitted toward a tissue of a wearer of the HMD that is proximate to or touching the portion of the frame of the HMD. Example locations of such a portion of a frame of an HMD may include a portion configured to be proximate to an ear of the wearer (e.g., proximate to a superior tragus, proximate to a superior auricular, proximate to a posterior auricular, proximate to an inferior auricular, or the like), proximate to a forehead of the wearer, or the like. It should be noted that multiple sets of light emitters and light sensors may be incorporated into a frame of an HMD such that PPG can be determined from measurements associated with multiple body locations of a wearer of the HMD.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A system, comprising:
a static random access memory (SRAM) device comprising:
a bit cell array comprising a plurality of bit cells, the plurality of bit cells arranged in a plurality of rows and a plurality of columns, each column of the plurality of columns operatively coupled to a pair of bit lines, wherein the plurality of columns is arranged as a plurality of column groups each comprising a plurality of local columns,
a row decoder that is configured to operatively couple a word line to a row of the plurality of rows of bit cells based at least in part on a row address provided to the row decoder, and
a plurality of column decoders, each associated with a column group of the plurality of column groups, wherein each column decoder is configured to operatively couple a data line to a local column of the plurality of local columns corresponding to a column group of the plurality of column groups associated with said column decoder; and
a controller configured to, for a column group of the plurality of column groups, read the local columns of the plurality of local columns included in the column group by, for a given local column, sensing a voltage difference on a corresponding pair of bit lines, in a rearranged sequential order that is different from a physical sequential order of the plurality of local columns in the column group, and wherein the rearranged sequential order is based at least in part on speed information associated with the local columns of the plurality of local columns such that a first local column is selected before a second local column, the first local columns being associated with a faster bit line than the second local column.

2. The system of claim 1, wherein the rearranged sequential order is determined based at least in part on a reorder signal obtained by the controller.

3. The system of claim 2, wherein the reorder signal is a binary signal.

4. The system of claim 3, wherein the sequential order is a reverse of the physical sequential order.

5. The system of claim 4, wherein the sequential order is determined based on an exclusive OR (XOR) operation of the reorder signal with bits of the column addresses associated with the local columns.

6. The system of claim 1, wherein sensing the voltage difference on the corresponding pair of bit lines in the sequential order that is different from the physical sequential order of the plurality of local columns comprises sensing the voltage difference of a pair of bit lines associated with a local column having a first access time prior to sensing the voltage difference of a pair of bit lines associated with a local column having a second access time, the second access time being longer than the first access time.

7. The system of claim 1, wherein the controller is further configured to provide a row address to the row decoder that causes the word line corresponding to the row of the plurality of rows associated with the row address to be asserted prior to reading the local columns of the plurality of local columns.

8. The system of claim 7, wherein the controller is further configured to de-assert the word line after the local columns have been read in the rearranged sequential order.

9. The system of claim 1, wherein a signal representative of the rearranged sequential order is utilized by a column multiplexer to select local columns of the plurality of local columns in the rearranged sequential order.

10. A system, comprising:
a static random access memory (SRAM) device comprising:
a bit cell array comprising a plurality of bit cells, the plurality of bit cells arranged in a plurality of rows and a plurality of columns, each column of the plurality of columns operatively coupled to a pair of bit lines, wherein the plurality of columns is arranged as a plurality of column groups each comprising a plurality of local columns, and wherein the plurality of columns includes one or more redundant columns;
a row decoder that is configured to operatively couple a word line to a row of the plurality of rows of bit cells based at least in part on a row address provided to the row decoder; and
a plurality of column decoders, each associated with a column group of the plurality of column groups, wherein each column decoder is configured to operatively couple a data line to a local column of the plurality of local columns corresponding to a column group of the plurality of column groups associated with said column decoder; and
a controller configured to:
obtain an address of a bit cell in the bit cell array for which a sequential memory access operation is to be performed, wherein the address comprises a row address, a column group identifier, and a local column address;
map the row address, the column group identifier, and the local column address to a repaired address corresponding to a repaired bit cell, wherein the repaired address corresponds to a redundant column of the one or more redundant columns, wherein a first bit cell of the redundant column corresponds to a faulty bit cell of a first local column and a second bit cell of the redundant column corresponds to a faulty bit cell of a second local column that is different than the first local column;
provide the row address to the row decoder that causes the word line corresponding to a row of the plurality of rows associated with the row address to be asserted;
perform the sequential memory access operation at the repaired address by selecting the redundant column corresponding to the repaired address; and
perform at least one other sequential memory access operation by selecting at least one other local column prior to de-asserting the word line.

11. The system of claim 10, wherein a row of the first bit cell of the redundant column is the same as a row of the faulty bit cell of the first local column.

12. The system of claim 10, wherein mapping the row address, the column group identifier, and the local column address to the repaired address comprises obtaining the repaired address from a look up table by providing the row address, the column group identifier, and the local column address to the look up table.

13. The system of claim 12, wherein the look up table is pre-configured based on testing of the SRAM device.

14. The system of claim 12, wherein the look up table is operatively coupled to a multiplexer configured to select the redundant column corresponding to the repaired address.

15. The system of claim 10, wherein the one or more redundant columns comprise at least two redundant columns, and wherein the at least two redundant columns are associated with different column groups of the plurality of column groups.

16. The system of claim 10, wherein the controller is further configured to pre-charge a set of bit lines corresponding to a plurality of local columns included in a column group corresponding to the column group identifier, and wherein mapping the row address, the column group identifier, and the local column address to the repaired address occurs concurrently with the pre-charging the set of bit lines.

17. The system of claim 10, wherein mapping the row address, the column group identifier, and the local column address to the repaired address occurs concurrently with the word line being asserted.

18. The system of claim 10, wherein at least one local column of the column group associated with the column group identifier does not have a corresponding redundant column included in the one or more redundant columns.

19. A system, comprising:
a static random access memory (SRAM) device, comprising:
a bit cell array comprising a plurality of bit cells, the plurality of bit cells arranged in a plurality of rows and a plurality of columns, each column of the plurality of columns operatively coupled to a pair of bit lines, wherein the plurality of columns is arranged as a plurality of column groups each comprising a plurality of local columns;
a row decoder that is configured to operatively couple a word line to a row of the plurality of rows of bit cells based at least in part on a row address provided to the row decoder; and
a plurality of column decoders, each associated with a column group of the plurality of column groups, wherein each column decoder is configured to operatively couple a data line to a local column of the plurality of local columns corresponding to a column group of the plurality of column groups associated with said column decoder; and
a controller configured to, for a column group of the plurality of column groups:
provide a row address to the row decoder that causes the word line corresponding to a row of the plurality of rows associated with the row address to be asserted;

responsive to determining that a sequential memory access operation of a series of memory access operations is to be performed on a slow bit line of the one or more bit lines having an access time that is longer than the access times associated with at least one other bit line of the one or more bit lines, causing a delay of at least a subset of memory access operations of the series of memory access operations; and perform the at least the subset of memory access operations after a time period associated with the delay has elapsed.

20. The system of claim 19, wherein causing the delay of at least the subset of memory access operations is responsive to enabling of a stall signal, and wherein performing the at least the subset of the memory access operations after the time period associated with the delay has elapsed is responsive to disabling the stall signals.

21. The system of claim 20, wherein enabling the stall signal and disabling the stall signal is performed using a handshaking protocol associated with performing the series of memory access operations.

22. The system of claim 21, wherein the handshaking protocol is associated with a row stride and/or a column stride for performing the series of memory access operations.

23. The system of claim 19, wherein the series of memory access operations comprise a series of read operations.

24. The system of claim 23, wherein pre-charging of the one or more bit lines is extended during the time period.

25. The system of claim 23, wherein the at least the subset of memory access operations comprises all of the memory access operations in the series of memory access operations.

26. The system of claim 19, wherein the series of memory access operations comprise a series of write operations.

27. The system of claim 26, wherein the slow bit line is driven during the time period.

28. The system of claim 26, wherein the at least the subset of memory access operations comprises memory access operations subsequent to access of the local column associated with the slow bit line.

29. The system of claim 19, wherein the time period corresponds to a clock cycle.

* * * * *